United States Patent
Kawaguchi et al.

(10) Patent No.: US 7,485,921 B2
(45) Date of Patent: Feb. 3, 2009

(54) TRENCH GATE TYPE MOS TRANSISTOR SEMICONDUCTOR DEVICE

(75) Inventors: Yusuke Kawaguchi, Miura-gun (JP); Yoshihiro Yamaguchi, Saitama (JP); Syotaro Ono, Yokohama (JP); Miwako Akiyama, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/674,337

(22) Filed: Feb. 13, 2007

(65) Prior Publication Data
US 2007/0194375 A1      Aug. 23, 2007

(30) Foreign Application Priority Data
Feb. 20, 2006    (JP) ............... 2006-041954

(51) Int. Cl.
  *H01L 29/78* (2006.01)
(52) U.S. Cl. ............. 257/331; 257/129; 257/139; 257/144; 257/152; 257/333; 257/341; 257/409; 257/E21.384; 257/E29.021; 257/E29.201; 438/242; 438/243
(58) Field of Classification Search ........... 257/288, 257/330, 331, 129, 139, 144, 152, 333, 341, 257/E21.384, E20.021, E29.201
See application file for complete search history.

(56) References Cited

U.S. PATENT DOCUMENTS

| | | | | |
|---|---|---|---|---|
| 5,034,341 A | * | 7/1991 | Itoh | ............ 438/242 |
| 5,894,149 A | * | 4/1999 | Uenishi et al. | ............ 257/331 |
| 6,300,171 B1 | | 10/2001 | Frisina | |
| 6,639,260 B2 | * | 10/2003 | Suzuki et al. | ............ 257/288 |
| 6,844,592 B2 | | 1/2005 | Yamaguchi et al. | |
| 2006/0043478 A1 | | 3/2006 | Yamaguchi et al. | |
| 2007/0194375 A1 | | 8/2007 | Kawaguchi et al. | |

FOREIGN PATENT DOCUMENTS

JP    2003-273355    9/2003

OTHER PUBLICATIONS

U.S. Appl. No. 11/936,412, filed Nov. 7, 2007, Ono, et al.
U.S. Appl. No. 11/943,181, filed Nov. 20, 2007, Kawaguchi, et al.

* cited by examiner

*Primary Examiner*—M. Wilczewski
*Assistant Examiner*—Tsz K Chiu
(74) *Attorney, Agent, or Firm*—Oblon, Spivak, McClelland, Maier & Neustadt, P.C.

(57) ABSTRACT

This semiconductor device comprises a first semiconductor layer of a first conductivity type, an epitaxial layer of a first conductivity type formed in the surface on the first semiconductor layer, and a base layer of a second conductivity type formed on the surface of the epitaxial layer. Column layers of a second conductivity type are repeatedly formed in the epitaxial layer under the base layer at a certain interval. Trenches are formed so as to penetrate the base layer to reach the epitaxial layer; and gate electrodes are formed in the trenches via a gate insulation film. A termination layer of a second conductivity type is formed on the epitaxial layer at an end region at the perimeter of the base layer. The termination layer is formed to have a junction depth larger than that of the base layer.

8 Claims, 4 Drawing Sheets

TRENCH GATE TYPE MOS TRANSISTOR SEMICONDUCTOR DEVICE

CROSS REFERENCE TO RELATED APPLICATIONS

This application is based on and claims the benefit of priority from prior Japanese Patent Application No. 2006-41954, filed on Feb. 20, 2006, the entire contents of which are incorporated herein by reference.

BACKGROUND OF THE INVENTION

1. Field of the Invention

The present invention relates to a semiconductor device, more particularly to a semiconductor device including a so-called trench gate type MOS transistor.

2. Description of the Related Art

In recent years, demands of power MOS transistors are increasing rapidly, not only in a market of switching power supplies with large current and high breakdown voltage (for example, a breakdown voltage of 600V), but also in a market of energy-saving switching devices used in a mobile communication device including a notebook PC (for example, a breakdown voltage of 30V).

A power MOS transistor used in such an energy-saving switching device market is required to reduce its driving voltage so that it can be driven directly by a voltage from a battery. It is also required to reduce its ON-resistance, and its gate-drain capacitance for reduction of switching loss, and so forth.

On the other hand, an ON-resistance of a MOS transistor mainly consists of a channel resistance and drift resistance. A structure called super-junction structure is known as a structure of a MOS transistor for reducing a drift resistance.

A super-junction structure forms a drift layer as a structure in which longwise strip-shaped p-type pillar layers and n-type pillar layers are embedded in turn in the transverse direction (for example, see JP 2003-273355 A). When a charge quantity (an impurity quantity) in a p-type pillar layer is equal to that in an n-type pillar layer in a super-junction structure, a pseudo non-doped layer can be formed therein. Thereby, a low ON-resistance beyond a material limit is realized by flowing a current in a high-doped n-type pillar layer, while keeping a required breakdown voltage.

Even in a power MOS transistor having a breakdown voltage of about 30V suitable for an energy-saving switching element, it is possible to form a MOS transistor with a low ON resistance by forming a drift layer of super-junction structure.

However, in a power MOS transistor having a low breakdown voltage of about 30V used for an energy-saving switching element, a pitch of a super-junction structure needs to be shortened to about 1 micrometer, which is shorter than a power MOS transistor of a large current and a high breakdown voltage. Such a narrow-pitched super-junction structure must be formed in the last step in a process including a MOSFET-forming process, in order to prevent thermal diffusion. Thus, it is difficult to form such a narrow-pitched super-junction structure not only in an element region but also in an end region surrounding the element region.

For this reason, in a power MOS transistor with a breakdown voltage of about 30V used for an energy-saving switching element, concentration of electric field in an end region could not be eased enough. Therefore, a breakdown voltage in an end region cannot be high enough compared to that in an element region. This is recognized as a problem.

SUMMARY OF THE INVENTION

A semiconductor device according to one aspect of the present invention comprises: a first semiconductor layer of a first conductivity type; an epitaxial layer of a first conductivity type formed in the surface on the first semiconductor layer; a base layer of a second conductivity type formed on the surface of the epitaxial layer; column layers of a second conductivity type repeatedly formed in the epitaxial layer under the base layer at a certain interval; a diffusion layer of a first conductivity type formed selectively in the base layer; trenches formed so as to penetrate the base layer to reach the epitaxial layer; gate electrodes formed in the trenches via a gate insulation film formed on an inner wall of the trench; a first main electrode connected to the back side of the first semiconductor layer; a second main electrode connected to the diffusion layer and the base layer; and a termination layer of a second conductivity type formed on the epitaxial layer at an end region at the perimeter of the base layer, the termination layer being formed to have a junction depth larger than that of the base layer.

A semiconductor device according to another aspect of the present invention comprises: a first semiconductor layer of a first conductivity type; an epitaxial layer of a first conductivity type formed in the surface on the first semiconductor layer; a base layer of a second conductivity type formed on the surface of the epitaxial layer; column layers of a second conductivity type repeatedly formed in the epitaxial layer under the base layer at a certain interval; a diffusion layer of a first conductivity type formed selectively in the base layer; trenches formed so as to penetrate the base layer to reach the epitaxial layer; gate electrodes formed in the trenches via a gate insulation film formed on an inner wall of the trench; a first main electrode connected to the back side of the first semiconductor layer; a second main electrode connected to the diffusion layer and the base layer; and a semiconductor layer of a first conductivity type formed under the base layer at the perimeter of the column layer at an outermost portion and having an impurity concentration lower than the epitaxial layer.

DETAILED DESCRIPTION OF THE EMBODIMENTS

Next, a semiconductor device according to embodiments of the present invention will be explained in detail with reference to drawings.

First Embodiment

Figure 1:
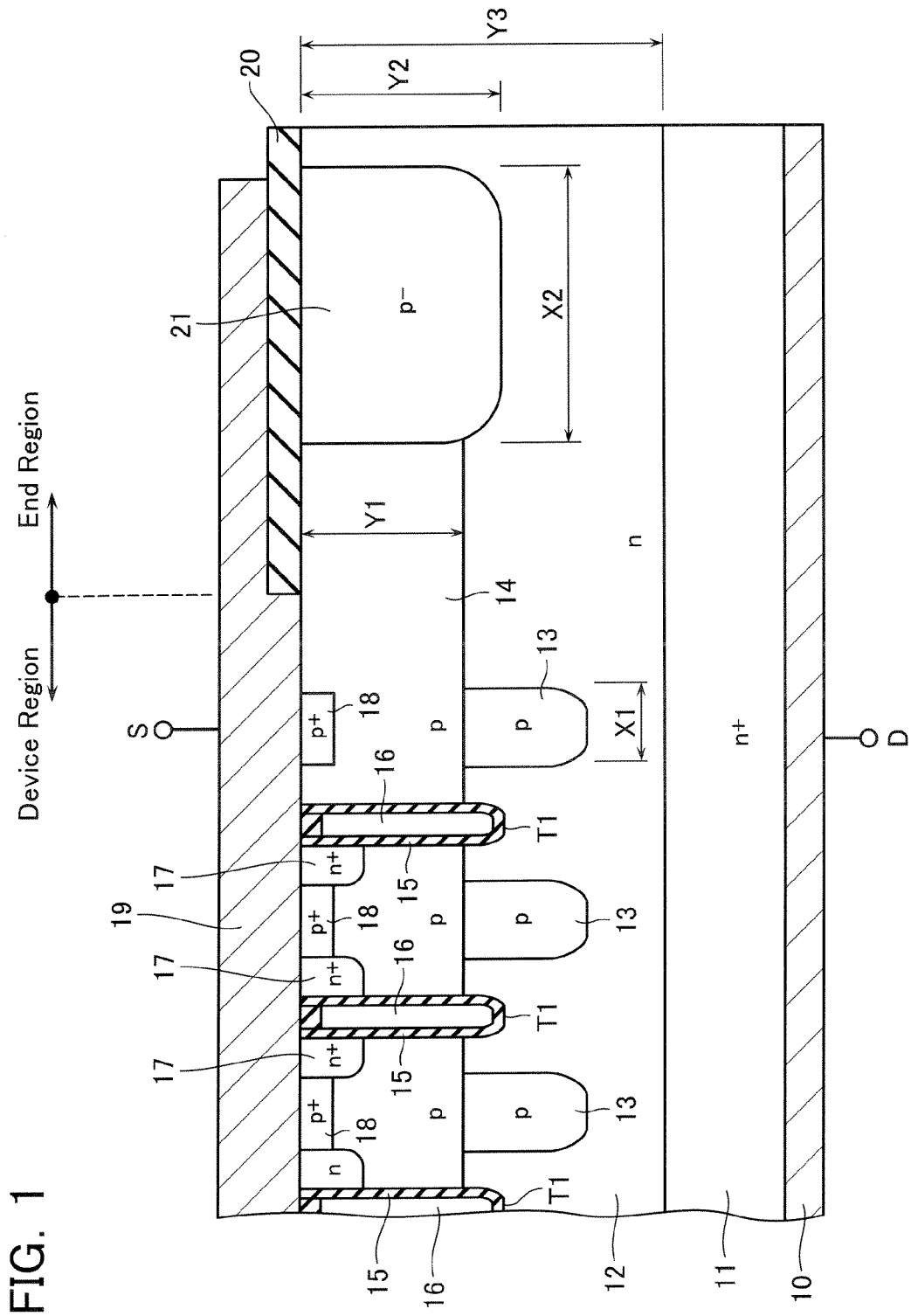
FIG. 1 shows a cross-sectional structure of the semiconductor device according to the first embodiment of the present invention.

FIG. 1 illustrates a cross-sectional structure of a semiconductor device according to a first embodiment of the present invention.

This semiconductor device is composed of an element region in which a semiconductor device, for example, a so-called trench-gate type n-channel MOS transistor is formed, and an end region formed to surround this element region. AMOS transistor in this embodiment is supposed to be a MOS transistor with a breakdown voltage of about 30V for the energy-saving switching device market used on a mobile communication device. Furthermore, although a trench gate type n-channel MOS transistor is explained as an example here, the present invention may not be limited to this. It may include a p-channel MOS transistor. The present invention may be applied to an IGBT, a Schottky-barrier diode, and so forth. Moreover, the present invention is applicable also to the planer type semiconductor device instead of a trench gate type.

As shown in FIG. 1, an n-channel MOS transistor formed in the element region is equipped with an n+ type silicon substrate 11. This n+ type silicon substrate 11 functions as a drain layer connected to a drain electrode 10 in the rear surface.

On this silicon substrate 11, an n-type epitaxial layer 12 with a lower impurity concentration and higher resistance than those of the silicon substrate 11, is formed to have a thickness of 3-4 micrometers for example.

P-type column layers 13 are formed at an interval of a predetermined pitch, for example, 1 micrometer, on the n-type epitaxial layer 12. The width X1 of the p-type column layer 13 itself is about 0.5 micrometer, for example.

Although the column layer 13 is formed to have a stripe shape in the direction perpendicular to the paper plane, the column layer 13 may not be limited to this. For example, it may be formed to have a lattice shape, or a hound tooth check shape in a plan view.

A super-junction structure is formed by these column layers 13 and the n-type epitaxial layer 12 sandwiched therebetween. That is, the p-type pillar layers are constituted by the column layers 13, and n-type pillar layers are constituted by the n-type epitaxial layer 12 inserted between the column layers 13. And a pseudo non-doped layer can be formed, if the charge quantity (impurity quantity) contained in pn pillars are the same.

A p-type base layer 14 is formed on the upper part of the super-junction structure portion, i.e., on the upper part of the column layer 13. Plural trenches T1 are formed in the p-type base layer 14 at positions between the column layers 13. That is, the trenches T1 are formed on the n-type pillar layers so that they penetrates the p-type base layer 14 to reach the epitaxial layer 12.

The trench T1 is formed to have a stripe shape in a direction perpendicular to the paper plane. Instead of a stripe shape, the trench T1 may be formed to form mesh shape.

The gate electrode 16 is formed in the trench T1 by burying polysilicon therein via a gate insulator film 15, in order to form a gate electrode of a trench-gate type MOS transistor.

Moreover, an n+ type source layer 17 and a p+ type contact layer 18 are formed on the surface of the p-type base layer 13 by diffusion at positions adjacent to the gate electrode 16. The source electrode 19 is formed so that it connects to the n+-type source layer 17 and the p+-type contact layer 18. The source electrode 19 is extended to the end region via a field plate insulation film 20, and the extended portion serves as a field-plate electrode for extending a depletion layer in a transverse direction to alleviate the concentration of the electric field when the MOS transistor is in a non-conductive state. A p-type termination layer 21 is formed in the surface of the epitaxial layer 12 at the end region under the field plate insulation film 20. The p-type termination layer 21 has a junction depth Y2 deeper than a junction depth Y1 of the p-type base layer 14.

The significance of this p-type termination layer 21 will be explained hereinbelow. As mentioned above, in a MOS transistor for a market of an energy-saving switching device with a breakdown voltage of about 30V used in mobile communication devices, the pn-pillar pitch of a super-junction structure is set at 1 micrometer for example, which is very small. For this reason, the column layer 13 needs to be formed by ion implantation using a mask in the process after the heating process for forming a MOS transistor which is described later. Therefore, the column layers 13 may be formed only in the element region, and it is difficult to form them in the end region.

However, if an end region is formed of the epitaxial layer 12 given high impurity concentration because of formation of a super-junction structure, a breakdown voltage of the end region becomes low compared to the element region.

Therefore, in this embodiment, the p-type termination layer 21 whose junction depth Y2 is deeper than the junction depth Y1 of the p-type base layer 14 is formed in the end region. The p-type termination layer 21 preferably has a larger width X2 than the width X1 of the column layer 13.

As described above, the termination layer 21 with the large junction depth is formed. Thereby, a depletion layer spreads between the n-type epitaxial layer 12 and the termination layer 21 at the end region up to the bottom of the epitaxial layer 12, when a reverse bias voltage is applied at the time of turnoff of a MOS transistor. This alleviates concentration of electric field in the end region. Therefore, the breakdown voltage of the end region may be kept higher enough compared to that in the element region. In addition, the junction depth Y2 of the termination layer 21 is desirably 40% or more of thickness Y3 of the epitaxial layer 12.

Figure 2:
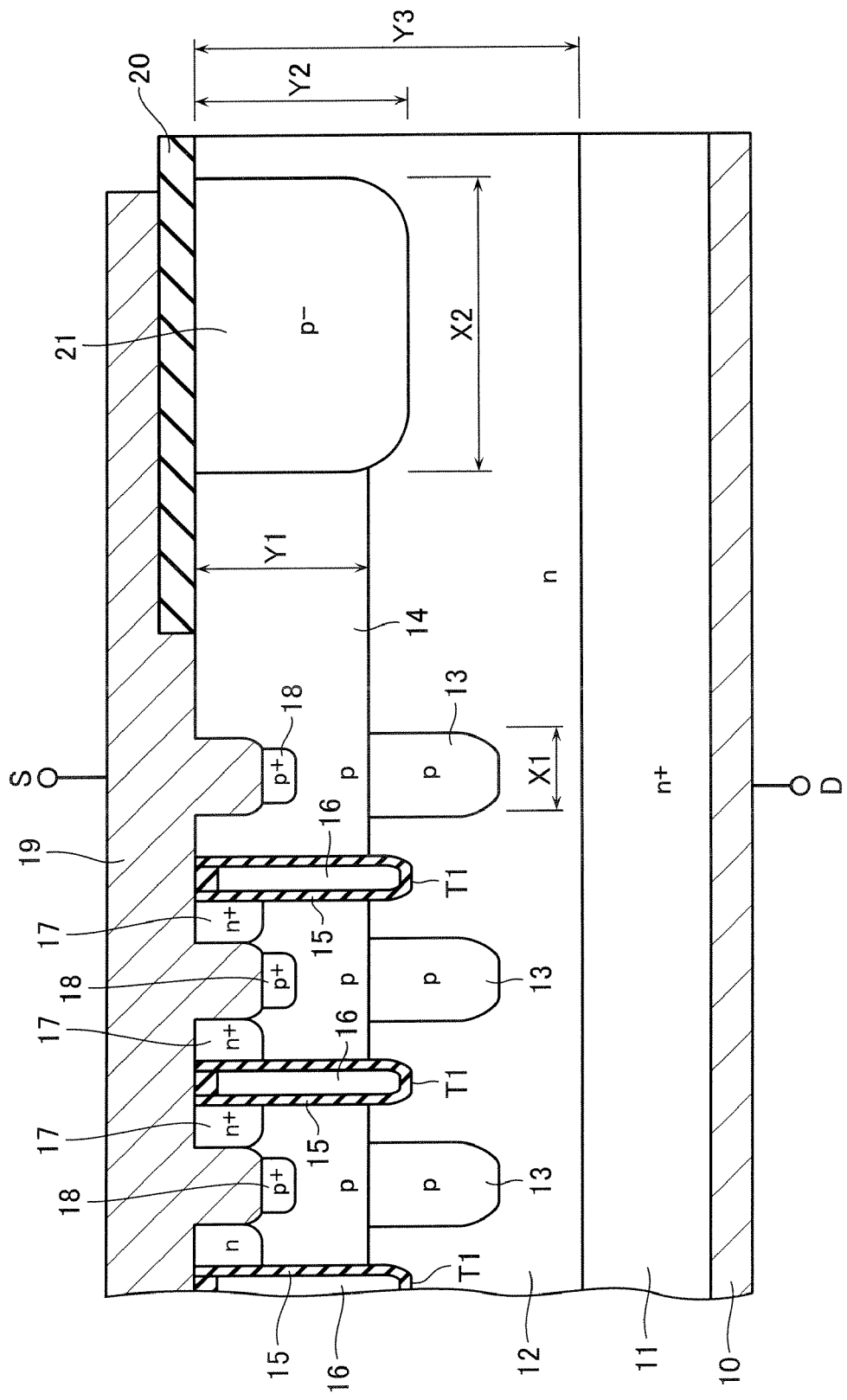
FIG. 2 shows a modified example of the first embodiment.

As shown in FIG. 2, this embodiment may be modified so that trenches are formed in the surface of the p-type base layer 14 over the upper part of the column layer 13, and the contact layer 18 is formed in the bottom of these trenches. The source electrode 19 may be embedded in these trenches. In this case, when forming the column layers 13 by ion implantation, it is possible to perform the implantation with lower energy.

Second Embodiment

Figure 3:
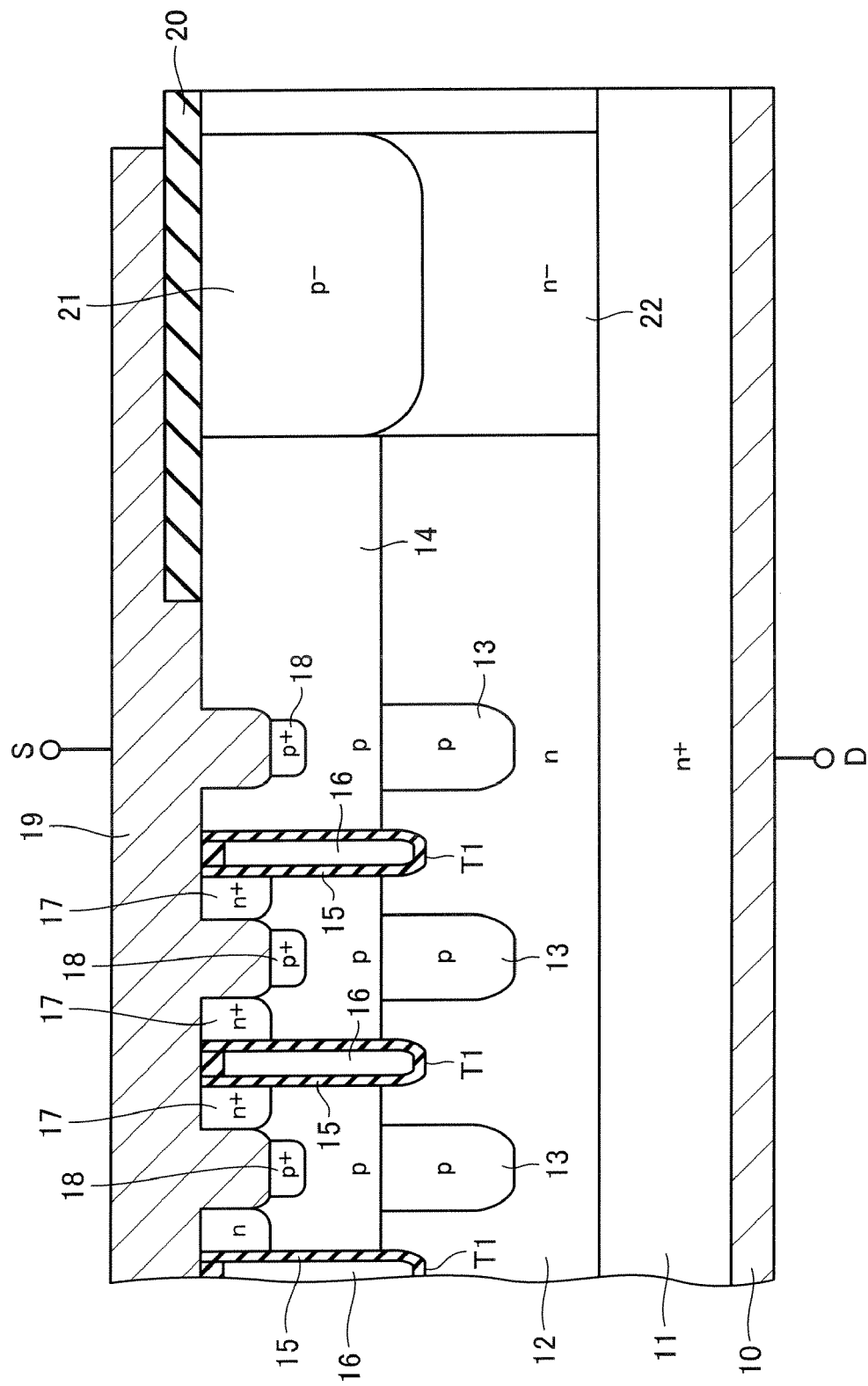
FIG. 3 shows a cross-sectional structure of the semiconductor device according to the second embodiment of the present invention.

Next, the second embodiment of the present invention will be explained with reference to FIG. 3. In FIG. 3, the same numerals are given to the same components as FIG. 1, and these components have the same structures and functions. Therefore, the detailed explanation thereof is omitted hereinbelow.

This embodiment comprises an n-type embedded layer 22 under the p-type termination layer 21. This layer has an effective impurity concentration and a career concentration lower than those in the n-type epitaxial layer 12 and a high resistance. This n-type embedded layer 22 may be formed by carrying out ion implantation of boron (B) with high energy, when forming the termination layer 21. As described above, by forming the n-type embedded layer 22 with lower career concentration under the termination layer 21, a depletion layer spreads in the end region easily at the time of the non-conductive state of a MOS transistor, and it is possible to raise the breakdown voltage of the end region more.

Third Embodiment

Figure 4:
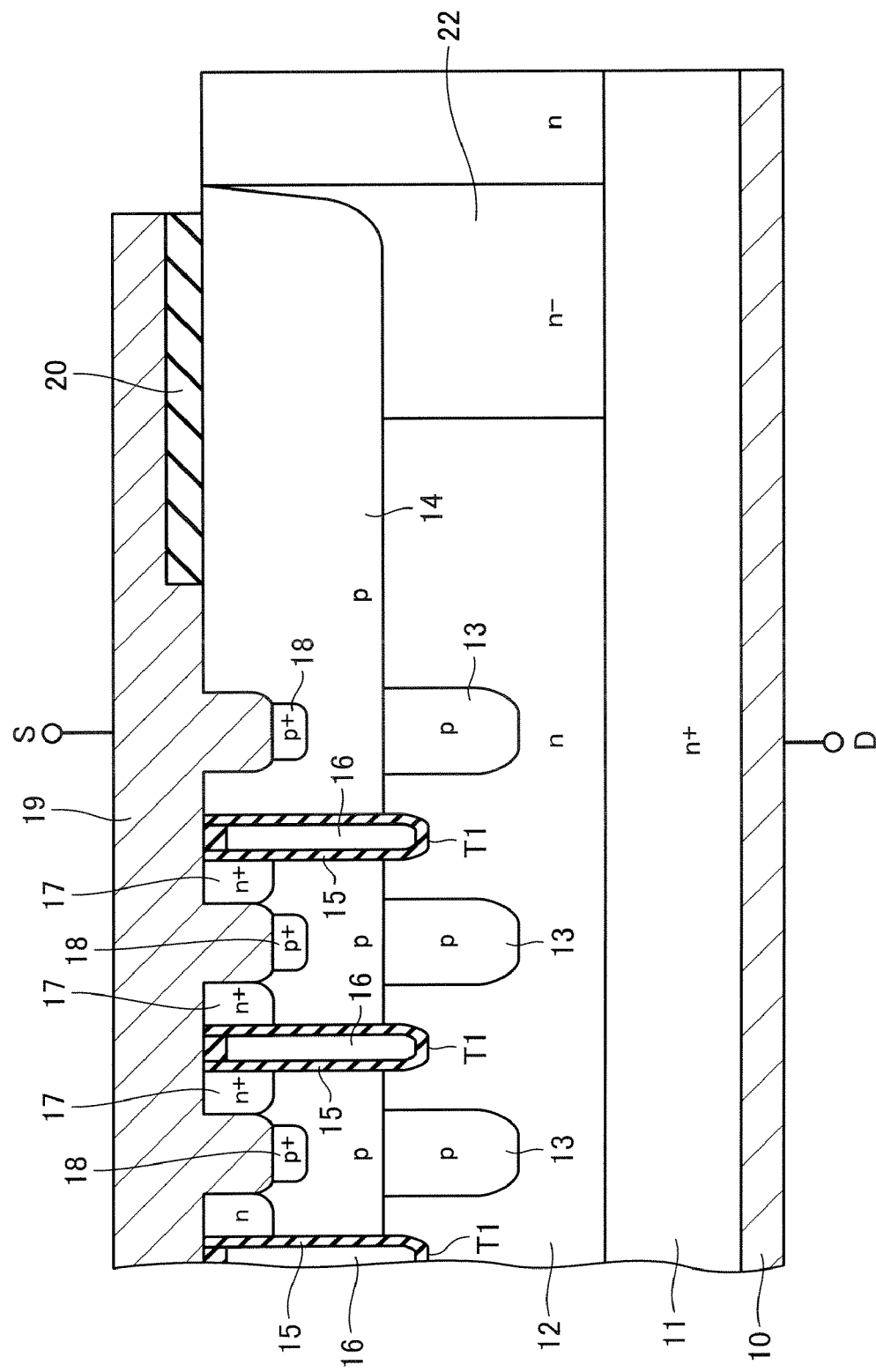
FIG. 4 shows a cross-sectional structure of the semiconductor device according to the third embodiment of the present invention.

Next, the third embodiment of the present invention will be explained with reference to FIG. 4. In FIG. 4, the same numerals are given to the same components as FIG. 3, and these components have the same structures and functions. Therefore, the detailed explanation thereof is omitted hereinbelow.

This embodiment is different from the second embodiment in that the termination layer 21 is not formed in the end region, and only the n-type embedded layer 22 is formed in the bottom of the epitaxial layer 12. The p-type base layer 14 is extended to the end region. Also in this embodiment, if the career concentration of the n-type embedded layer 22 is set low, it is possible to extend a depletion layer close to the silicon substrate 11 at the time of the non-conductive state of a MOS transistor. This may maintain the breakdown voltage of the end region high enough compared to that in the element region.

Although the embodiments of the present invention has been explained, various changes, additions or the like are possible for the present invention without departing from the scope thereof.

What is claimed is:

1. A semiconductor device comprising:
   a first semiconductor layer of a first conductivity type;
   an epitaxial layer of a first conductivity type formed in the surface on the first semiconductor layer;
   a base layer of a second conductivity type formed on the surface of the epitaxial layer;
   column layers of a second conductivity type repeatedly formed in the epitaxial layer under the base layer at a certain interval;
   a diffusion layer of a first conductivity type formed selectively in the base layer; trenches formed so as to penetrate the base layer to reach the epitaxial layer;
   gate electrodes formed in the trenches via a gate insulation film formed on an inner wall of the trench;
   a first main electrode connected to the back side of the first semiconductor layer;
   a second main electrode connected to the diffusion layer and the base layer; and
   a termination layer of a second conductivity type formed on the epitaxial layer at an end region at the perimeter of the base layer, the termination layer being formed to have a junction depth larger than that of the base layer, impurity concentration of the termination layer being set lower than the impurity concentration of the column layer,
   wherein the column layers are formed exclusively under the base layer.

2. The semiconductor device according to claim 1, wherein the width of the termination layer is larger than the width of the column layer.

3. The semiconductor device according to claim 1, wherein a junction depth of the termination layer is set as 40% or more of the thickness of the epitaxial layer.

4. The semiconductor device according to claim 1, further comprising second trenches formed in a surface of the base layer over the column layers.

5. The semiconductor device according to claim 4, further comprising a contact layer of a second conductivity type formed in the bottom of the second trenches.

6. The semiconductor device according to claim 1, further comprising a field plate insulation film formed over the termination layer, the second main electrode extending over the field plate insulation film.

7. The semiconductor device according to claim 1, further comprising an embedded layer of a first conductivity type with impurities concentration lower than the impurity concentration of the epitaxial layer under termination layer.

8. A semiconductor device comprising:
   a first semiconductor layer of a first conductivity type;
   an epitaxial layer of a first conductivity type formed in the surface on the first semiconductor layer;
   a base layer of a second conductivity type formed on the surface of the epitaxial layer;
   column layers of a second conductivity type repeatedly formed in the epitaxial layer under the base layer at a certain interval;
   a diffusion layer of a first conductivity type formed selectively in the base layer;
   trenches formed so as to penetrate the base layer to reach the epitaxial layer;
   gate electrodes formed in the trenches via a gate insulation film formed on an inner wall of the trench;
   a first main electrode connected to the back side of the first semiconductor layer;
   a second main electrode connected to the diffusion layer and the base layer; and
   a semiconductor layer of a first conductivity type formed under the base layer at the perimeter of the column layer at an outermost portion and having an impurity concentration lower than the epitaxial layer.

* * * * *